United States Patent [19]
D'Alto et al.

[11] Patent Number: 5,680,179
[45] Date of Patent: Oct. 21, 1997

[54] METHODS AND APPARATUS FOR FILTERING IMAGES USING FUZZY LOGIC

[75] Inventors: Viviana D'Alto, Milan; Massimo Mancuso, Favara; Rinaldo Poluzzi, Milan; Gianguido Rizzotto, Civate, all of Italy

[73] Assignee: SGS-Thomson Microelectronics S.r.l., Agrate Brianza, Italy

[21] Appl. No.: 534,000

[22] Filed: Sep. 27, 1995

[30] Foreign Application Priority Data

Sep. 30, 1994 [EP] European Pat. Off. .............. 94830470

[51] Int. Cl.$^6$ ............................... H04N 5/21; H04N 5/57
[52] U.S. Cl. .......................... 348/607; 348/618; 348/631; 348/673; 348/702
[58] Field of Search ....................... 348/618, 619, 348/620, 621, 606, 607, 628, 631, 673, 678, 687, 700, 701, 702, 713, 712; H04N 5/21, 5/213, 5/57

[56] References Cited

U.S. PATENT DOCUMENTS

| | | | |
|---|---|---|---|
| 4,646,138 | 2/1987 | Willis | 348/620 |
| 4,809,069 | 2/1989 | Mever et al. | 358/166 |
| 5,225,907 | 7/1993 | Casavant et al. | 348/607 |
| 5,404,179 | 4/1995 | Hamaski | 348/620 |
| 5,519,452 | 5/1996 | Parulski | 348/620 |
| 5,540,097 | 7/1996 | Hisata | 348/673 |

OTHER PUBLICATIONS

European Search Report from European Patent Application No. 94830470.4 filed Sep. 30, 1995.
1992 IEEE International Symposium On Circuits And Systems, vol. 3 of 6, 1992, San Diego, CA pp. 1491–1494, Alattar A.M., "A Probabilistic Filter For Eliminating Temporal Noise In Time–Varying Image Sequences".
Electronics Letters, vol. 28, No. 18, Aug. 27, 1992, UK, pp. 1715–1717, Russo & AL., "Fuzzy Operator For Sharpening Of Noisy Images".
Proceedings Spie, Nonlinear Processing V, 7–9 Feb. 1994, San Jose, CA, vol. 2180, pp. 332–339, Taguchi & AL. "Fuzzy Filters For Image Smoothing".
Electronics and Communications In Japan, Part 3, vol. 76, No. 7, 1993, pp. 27–36, Kaoru Arakawa, "Proposal Of Median–Type Fuzzy Filter and Its Optimum Design".
Mancuso et al, "Fuzzy Filter for Dynamic Range Reduction and Contrast Enhancement", Fuzzy Systems, Intl'l Conference, pp. 264(a–d)–267 Jun. 1994.
K. Arakama et al. "A Nonlinear Digital Filter Using Fuzzy Clustering", IEEE, pp. 309–312 Mar. 1992.
Peng et al, "Fuzzy Filtering for Mixed Noise Removal During Image Processing", IEEE, pp. 89–93 Jun. 1994.
Mancuso et al, "Fuzzy Edge–Oriented Motion–Adaptive Noise Reduction and Scanning Rate Conversion", IEEE, pp. 652–656 Dec. 1994.
Proceeding—SPIE, The International Society for Optical Engineering, "Nonlinear Processing Images V", Dougherty et al, Feb. 1994, vol. 2180 pp. 332–339.
Electronics & Communications in Japan, "Proposal of Median–Type Fuzzy Filter & It's Optimum Design", Arakawa et al, 93, vol. 76, Part 3, No. 7, pp. 27–35.

*Primary Examiner*—John K. Peng
*Assistant Examiner*—Jeffrey S. Murrel
*Attorney, Agent, or Firm*—Wolf, Greenfield & Sacks, P.C.; James H. Morris

[57] ABSTRACT

A device for filtering video images, of the type which includes first and second circuit portions, each having first and second input terminals respectively adapted to receive digitalized luminance and chrominance components of a television signal, and an output terminal coinciding with an output terminal of the device. The first and second circuit portions further include first, second and third filters, cascade coupled to one another, and a fourth filter, respectively.

The first, second and third filters incorporate a computational circuit which uses a logic of the fuzzy type to process the digitalized luminance component. The fourth filter includes a computational circuit which processes the digitalized chrominance components based upon a parameter supplied from the second filter.

36 Claims, 3 Drawing Sheets

METHODS AND APPARATUS FOR FILTERING IMAGES USING FUZZY LOGIC

BACKGROUND OF THE INVENTION

1. Field of the Invention

The present invention relates, in general, to devices for use in video applications, and more particularly to devices and methods for filtering video images such as TV pictures, using fuzzy logic.

2. Discussion of the Related Art

As is well known, the attainment of improved quality in TV receiver images is related to the possibility of reducing the noise which accompanies the television signal, and to the reduced bandwidth of the signal. Noise, being an inherent feature to any telecommunications system or television signal broadcasting network, can be reduced by different filtering methods.

The method of choice will be dependent on the characteristics of the type of noise to be filtered. For example, median filters are used to filter out noise of a pulsive nature. Recursive filters are used to filter out noise of the gaussian type. Both filtering methods achieve good results at an acceptable cost-to-performance ratio.

Although performing advantageously from several aspects, such techniques still cannot provide good filtering capabilities in an adaptive way.

Another problem which affects the quality of TV pictures, as mentioned above, is represented by the narrow bandwidth of the television signal.

It should not be overlooked that the television signal is a three-dimensional signal which has two spatial dimensions, horizontal and vertical, and a third dimension, time, which allows shot motion to be imaged.

The term "image field" will be used hereinafter to mean a set of lines forming a TV picture within a particular time interval.

The narrow bandwidth problem should be handled with reference to the three dimensions of the signal.

In the related art, an improvement is achieved in the spatial resolution of the TV picture by spatial filtering which adds a peak signal to the original television signal.

Alternatively, an improvement is achieved in time resolution by means of interpolation algorithms.

In either cases, the circuit architectures which result in improved TV picture resolution require spatial or space/time filtering of the signal.

The filtering provided by taking into account only the spatial information uses so-called "intra-field" interpolation algorithms, i.e. algorithms which utilize information present in one and the same image field.

Those algorithms which utilize information present in two consecutive image fields, thereby revealing the presence of motion (space/time filtering), are called "inter-field" algorithms.

Time resolution can also be improved by doubling the frequency of the image field through a scanning rate converter. Alternatively, time resolution can be improved by doubling the line frequency of an image field.

In each case, it is common practice to employ low-pass filters, whether it is noise or the TV signal that needs to be filtered. In this way, however, the outline of the imaged objects will be blurred or attenuated, which can only be remedied by the added use of expensive directional filters.

Recursive low-pass filters can even attenuate the high temporal frequencies related to the motion contents of an image sequence. These filters, therefore, should perform such that no filtering action is applied while motion is being detected. In such cases, the possibility of associating a motion detector with the filter architecture would be a desirable feature. Considering indeed a so-called pixel from a static region of the TV picture, it can be reproduced without filtering so as to leave the display resolution unaffected. But with a pixel which belongs to a motion region of the picture, what is to be displayed is instead the interpolated value of that pixel.

Improved quality of a TV picture is also related to image contrast and luminance. In fact, it is desirable in many cases to increase the contrast and decrease the luminance of an image due to greater variation in the image brilliance with respect to the sensitivity of the means that acquires or stores it. It is on this account that details which are present in highly brilliant or very dark areas of the image are inadequately brought out.

It should be emphasized that contrast is associated with details, whereas luminance conveys brilliance information. Two main approaches have been used in the related art to increase contrast and decrease luminance.

A first approach is based on image definition expressed as the product of an illumination component and a reflectance component.

By using a filtering of the homomorphic type, it becomes possible to reduce the illumination component, which is responsible for most of the change in brilliance, and simultaneously increase the reflectance component, which contains detail information.

The second approach is based on the use of a dual-channel filter which, through non-linear characteristics, produces a large increase in contrast where brilliance reduction is high.

It should be noted that the mean value of the illumination component represents locally the low spatial frequency component of the image, whereas contrast represents the high spatial frequency component.

Consequently, contrast can be obtained as the difference between the image and the averaged value of the illumination component.

Good results can only be achieved, by either the first or the second approach, on a narrow range of images, even though the variety of the images involved in a TV representation is quite large. It is indeed for this reason that filters having high adaptive modes should be provided.

SUMMARY OF THE INVENTION

Embodiments of the invention are directed to a device for filtering video images, and a method therefor, which by using a logic known from the technical literature as Fuzzy Logic, is adaptive, in the sense that it is capable of effectively filtering images beset with problems of noise reduction, space/time resolution, and wide brilliance variation. In this way, the image quality can be significantly improved.

An embodiment of the invention is directed to a device for filtering video images including first and second circuit portions. Each circuit portion has first and second input terminals, respectively adapted to receive a digitalized luminance component and a digitalized chrominance component of a television signal, and an output terminal corresponding to an output terminal of the device. The first circuit portion further includes a first filter, a second filter, and a third filter, the first, second and third filters being cascade coupled. The second circuit portion further includes a fourth filter. Each of the first, second and third filters includes computational circuit means for processing the digitalized luminance component with fuzzy logic. The fourth filter includes computational circuit means for operating on the digitalized chrominance components according to a parameter supplied from the second filter.

Another embodiment of the invention is directed to a method for filtering a television signal encoded in digital form. The method includes a pulsive noise reduction step; a gaussian noise reduction and consequent scan rate conversion step; and a brilliance reduction and concurrent contrast increase step. Each step includes the step of processing the television signal by operating a computational circuit using logic of the fuzzy type.

Another embodiment of the invention is directed to a system for filtering video images in a television apparatus. The system includes a first memory for a preceding image field having a first input terminal, a second input terminal, a first output terminal, and a second output terminal; a second memory for a current image field having a first input terminal, and a second input terminal, connected to inputs of the television apparatus, and adapted to receive luminance and chrominance components through an analog-to-digital converter block, and a first output terminal and a second output terminal; a digital-to-analog converter block having a first input terminal, a second input terminal, a first output terminal, and a second output terminal, each output terminal corresponding to output terminals of the television apparatus; and a television signal filtering device operated to a logic of the fuzzy type, and being feedback-connected to the first and second input terminals of the first memory, the television signal filtering device having input terminals connected to the first and second output terminals of each of the first memory and the second memory, and output connected to the first and second input terminals of the digital-to-analog converter block.

The features and advantages of a device, and associated method, according to this invention will be apparent from the following description of an embodiment thereof, given by way of example and not of limitation with reference to the accompanying drawings.

DETAILED DESCRIPTION

Figure 1:
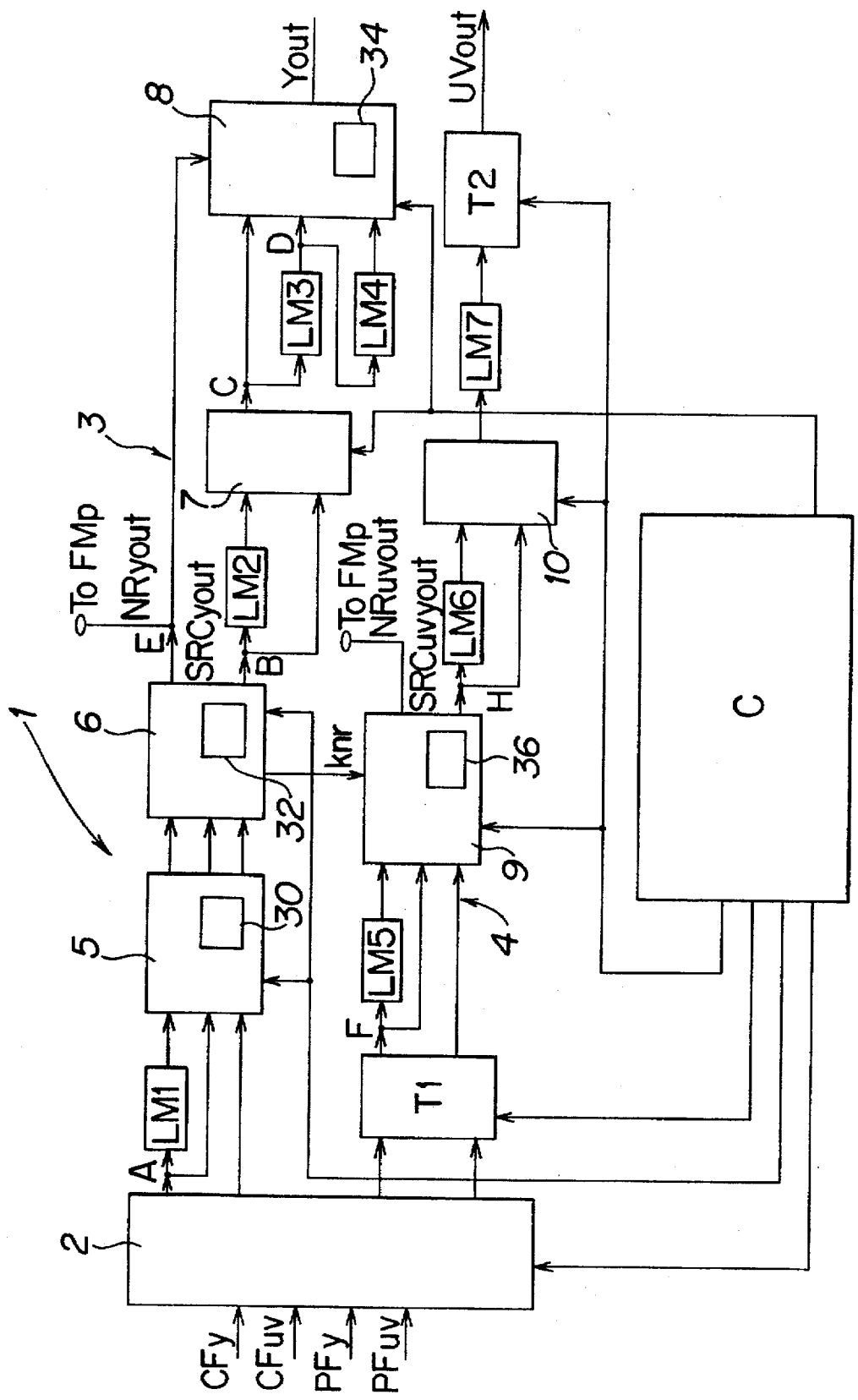
FIG. 1 is a diagram illustrating schematically a device according to the invention.

With reference to the drawing figures, generally and schematically shown at 1 is a device for filtering video images, such as TV pictures, using a fuzzy logic.

It should be noted that the TV signal is three-dimensional and in interlaced format. The signal has, therefore, three components: a component Y of the luminance signal and two more components, U and V, of the chrominance signal.

Figure 4:
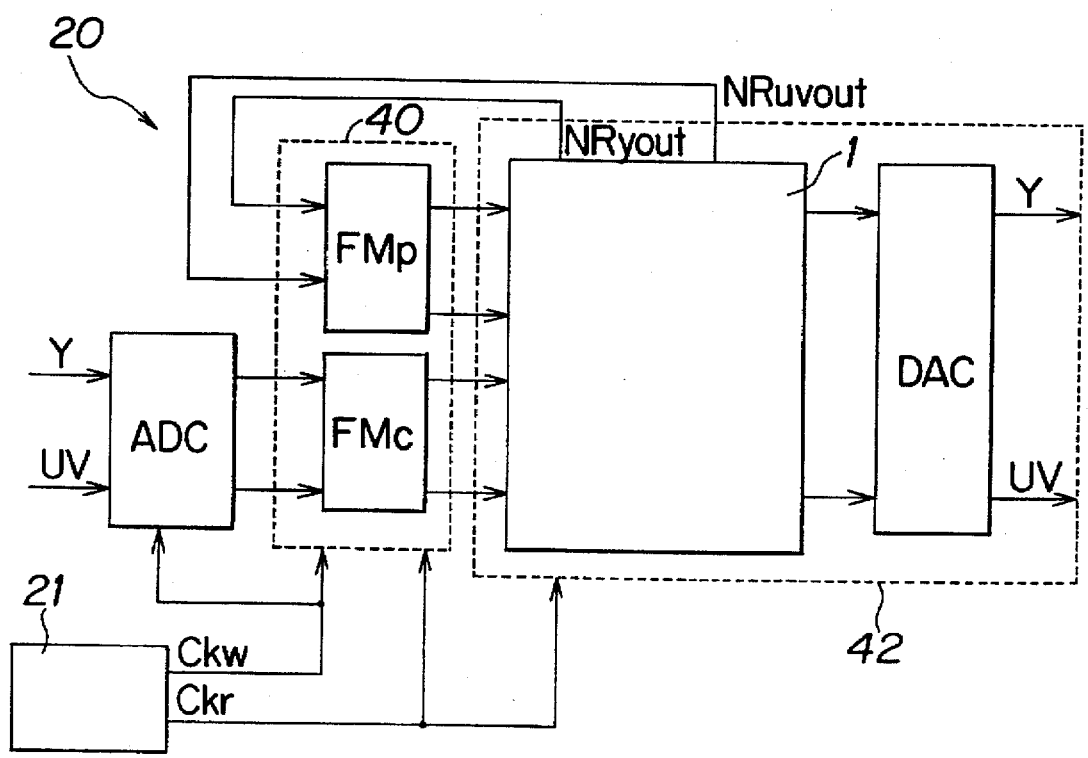
FIG. 4 shows schematically a TV apparatus according to the invention.

With reference to FIG. 4, the device 1 is incorporated to a television apparatus 20 which includes an analog-to-digital converter block ADC which has first and second input terminals corresponding to input terminals of the apparatus 20 and being adapted to receive luminance Y and chrominance U, V components, respectively, and first and second output terminals.

The television apparatus 20 further includes a first memory FMp and second memory FMc for the preceding image field and the current image field, respectively. Each memory has first and second input terminals and first and second output terminals.

More particularly, the first and second input terminals of the second memory FMc are connected to the output terminals of the analog-to-digital converter block ADC.

The output terminals of the first FMp and the second FMc memory are connected to input terminals of the device 1. In particular, the output terminals are connected to an interface circuit 2 to be described.

Also with reference to FIG. 4, the apparatus 20 further includes a clock signal block 21, effective to generate appropriate clock signals Ckw, Ckr and connected to a block 40 of both memories FMp and FMc, as well as to a block 42 of the digital-to-analog converter block and the device 1.

Lastly, the apparatus 20 includes a digital-to-analog converter block DAC which has first and second input terminals connected to first and second output terminals of the device 1, and first and second output terminals corresponding to output terminals of the apparatus 20.

As shown in FIG. 1, the device 1 is provided with at least four input terminals adapted to receive digital signals CFy, CFuv, PFy and PFuv. In particular, the digital signals CFy and CFuv are sampled luminance/chrominance signals from FMc which relate to a current image field, while the digital signals PFy and PFuv are corresponding digital signals of a preceding image field and supplied from FMp.

With reference to FIG. 1, the device 1 is shown to include an interface circuit 2 effective to permit operation of the device 1 with both a 4:1:1 format and a 4:2:2 format of the components Y, U and V. The circuit 2 is provided with first, second, third and fourth input terminals, which correspond to the input terminals of the device 1, and with first, second, third and fourth output terminals.

The device 1 also includes a first and a second circuit portion, being designated 3 and 4 and respectively adapted to process the luminance component Y and the chrominance components U and V.

Reference will be made hereinafter to the first circuit portion 3, which acts on the luminance component Y. It should be noted that this component contains information about the image brilliance, that is about the grey shade portion of the image.

It can be seen in FIG. 1 that the first circuit portion 3 includes a first line memory LM1, having an input terminal and an output terminal, and a first filter 5, having first, second and third input terminals as well as first, second and third output terminals. Specifically, the input terminal of the first line memory LM1 is connected to a first circuit node A which is, in turn, connected to the first output terminal of the interface circuit 2, while the output terminal of the first line memory LM1 is connected to the first input terminal of the first filter 5. The second and third input terminals of the first filter 5 are connected to the first circuit node A and the second output terminal of the interface circuit 2, respectively.

Figures 2A, 2B:
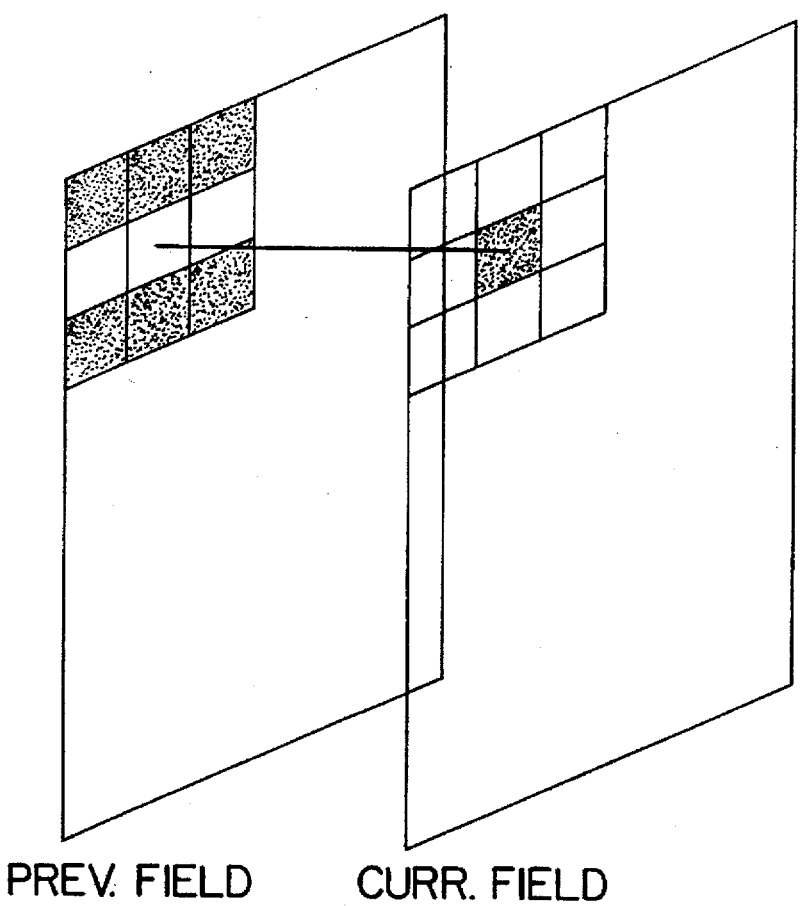
FIG. 2 is a diagram showing schematically a so-called working window of the device in FIG. 1.

The first filter 5 operates in accordance with the inventive method and, using fuzzy logic signal processing techniques, effects a reduction in the pulsive noise which is present in the luminance component Y of the television signal. More specifically, this filter acts on a working window or image window which is shown in FIG. 2 and obtained by suitably delaying the digital signals PFy and CFy. This window includes nine digital signals. The digital signals included in the first and the last line of the window belong to a preceding image field, whereas the digital signal X, on which the window is centered, belongs to the current image field and forms, therefore, the digital signal to be processed. On these signals, the first filter 5 performs so-called inference operations, through fuzzy hardware 30 known per se and incorporated within the first filter 5.

The inferential operations are basically configured as IF-THEN rules, with at least one initial or fore preposition and at least one consequent implication.

The first circuit portion 3 further includes a second filter 6 connected in a cascading manner with the first filter 5 and having first, second and third output terminals.

In accordance with a method of this invention, and using fuzzy logic signal processing techniques, this second filter 6 both performs a reduction in gaussian noise and a scanning rate conversion of the luminance component Y. More particularly, the second filter 6 acts on the same working window as shown in FIG. 2 and carries out, on the digital signals included in the window and obtained from the pulsive noise filtering step, appropriate inference operations through fuzzy hardware 32 incorporated thereto and known per se.

The second filter 6 outputs digital signals, respectively designated NRyout and SRCyout. The digital signal NRyout represents the signal obtained by the fuzzy step of filtering out the gaussian noise, while the digital signal SRCyout represents the signal obtained by the scan rate conversion step using fuzzy logic.

Figure 3:
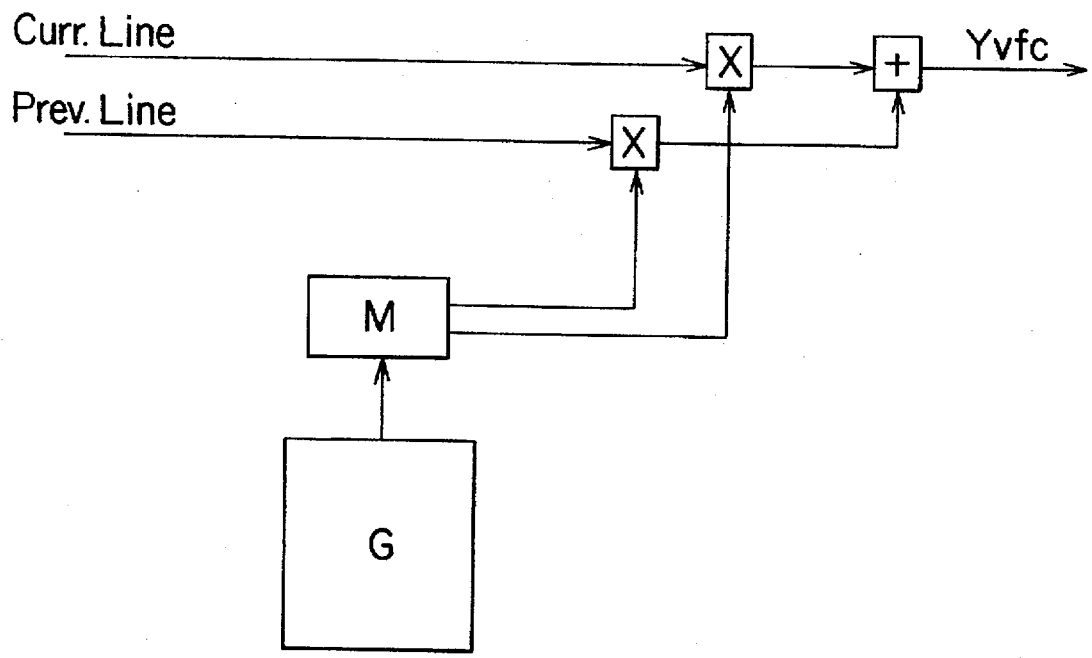
FIG. 3 is a fragmentary schematic diagram showing a detail of the device in FIG. 1.

Further, it can be seen in FIG. 1 that the first circuit portion 3 includes a second line memory LM2 having an input terminal and an output terminal, and a first format converter circuit 7 having first and second input terminals and an output terminal. Specifically, the input terminal of the second line memory LM2 is connected to a second circuit node B, being in turn connected to the second output terminal of the second filter 6. The output terminal of the second line memory LM2 is connected to the first input terminal of the first format converter circuit 7. The second input terminal of the first format converter circuit 7 is connected to the second circuit node B. The first format converter circuit 7, an embodiment of which is shown in FIG. 3, is adapted to perform a vertical format conversion of the suitably delayed digital signal SRCyout.

Before describing the structure of the first format converter circuit 7, it should be pointed out that the device 1 can provide different magnifications of the image being processed. In particular, the device 1 can provide a magnification of 12.5% or 25% of the image being processed. In either cases, however, to obtain a magnified image which would retain a correct proportion to its dimensions, a so-called vertical interpolation must be performed. This is performed in order to increase the number of the vertical lines which make up the magnified image compared to the original image. The interpolation algorithm used is given by the following formula:

$$Yvfc = h1 * CurrLine + h2 * PrevLine \quad (1)$$

where, Yvfc is the interpolated digital signal, and h1 and h2 are two parameters which take predetermined sets of values so as to keep the magnified image to the interlaced format. The sets of values taken by the parameters h1 and h2 vary with the magnification factor selected.

The format converter circuit shown in FIG. 3 is adapted to implement the formula (1) above. It includes a storage element M, such as a read-only memory, for storing the sets of values taken by the parameters h1 and h2, and a periodic storage address generator G which is connected to the storage element M.

Also in FIG. 1, it can be seen that the first circuit portion 3 further includes a third line memory LM3 and a fourth line memory LM4, each having an input terminal and an output terminal, and a third filter 8 provided with first, second, third and fourth input terminals as well as with an output terminal which forms a first output terminal Yout of the device 1. In particular, the input terminals of the line memories LM5 and LM6 are connected to a third circuit node C, in turn connected to the output terminal of the first format converter circuit 7, and to a fourth circuit node D, connected to the output terminal of the third line memory LM3, respectively.

The first and second input terminals of the third filter 8 are connected to the third circuit node C and the fourth circuit node D, respectively. The third and fourth input terminals of the third filter 8 are connected to the output terminal of the fourth line memory LM4 and to a fifth circuit node E, respectively. The latter is connected to the first output terminal of the second filter 6 and to the first input terminal of the first memory FMp for the preceding image field.

The third filter 8 is a dual channel filter adapted to perform, on the low-pass and the high-pass components of the luminance component Y, respectively a reduction in brilliance and an increase in contrast. More particularly, the third filter 8 will carry out, respectively on the low-pass component and the high-pass component, a first and a second fuzzy process using conventional fuzzy hardware 34 contained in the filter.

As mentioned above, the device 1 also includes a second circuit portion 4 intended for processing the chrominance components U and V.

With reference to FIG. 1, this second circuit portion 4 includes a first delay block T1 having first and second input terminals which are connected to the third and fourth output terminals of the interface circuit 2, respectively, and first and second output terminals. The first delay block T1 introduces a suitable time delay in the chrominance components U and V, so as to compensate for the delay already present in the luminance component Y as a result of the pulsive noise filtering step carried out by the first filter 5.

The second circuit portion 4 further includes a fifth line memory LM5 which has an input terminal and an output terminal, and a fourth filter 9 which has first, second, third and fourth input terminals and first and second output terminals. In particular, the input terminal of the fifth line memory LM5 is connected to a sixth circuit node F which is in turn connected to the first output terminal of the delay block T1. The output terminal of the fifth line memory LM5 is connected to the first input terminal of the fourth filter 9. The second and third input terminals of the fourth filter 9 are connected to the sixth circuit node F and the second output terminal of the delay block T1.

In addition, the fourth input terminal of the filter 9 is connected to the third output terminal of the second filter 6. The output terminal of the filter 9 is connected to the second input terminal of the first memory FMp for the preceding image field.

This fourth filter 9 both effects a reduction in gaussian noise and a scanning rate conversion on the chrominance components U and V of the television signal.

The fourth filter 9 processes the digital signals PFuv and CFuv, as suitably delayed, to produce a working or image window which has the same structure as that shown in FIG. 2 for the luminance component Y. In particular, the fourth filter 9 performs appropriate operations on the signals, based on a parameter knr supplied from the second filter 6, through conventional computational circuit means 36 incorporated thereto.

The fourth filter 9 outputs digital signals, respectively designated NRuvout and SRCuvout.

The digital signal NRuvout represents the resultant signal from the gaussian noise filtering step, and the digital signal SRCuvout represents the resultant signal from the scan rate conversion step.

Also shown in FIG. 1 is that the second circuit portion 4 further includes a sixth line memory LM6, having an input terminal and an output terminal, and a second format converter circuit 10, having first and second input terminals and an output terminal. More particularly, the input terminal of the sixth line memory LM6 is connected to a seventh circuit node H being in turn connected to the second output terminal of the fourth filter 9. The output terminal of the sixth line memory LM6 is connected to the first input terminal of the second format converter circuit 10. The second input terminal of the second format converter circuit 10 is connected to the seventh circuit node H.

The second format converter circuit 10 is effective to perform, on the suitably delayed signal SRCuvout, a vertical format conversion in accordance with the method previously described in connection with the first format converter circuit 7.

The second circuit portion 4 then includes a seventh line memory LM7, connected between the output terminal of the second format converter circuit 10 and an input terminal of a second delay block T2. The second delay block T2 is also provided with an output terminal UVout, which forms a second output terminal for the device 1. The second delay block T2 is effective to suitably delay the chrominance components U and V in order to compensate for the delay caused in the luminance component Y by the filtering steps carried out by the third filter 8.

Finally, the device 1 includes a control circuit C, shown in FIG. 1, which controls the internal synchronization of the device 1.

The filtering method of this invention will now be described with reference, in particular, to an initial state whereby the digital signals of a current image field and a preceding image field are presented at the input of the interface circuit 2. As mentioned above, the method and device of this invention allow both the pulsive noise and gaussian noise present in the television signal to be reduced.

The reduction in pulsive noise is only performed on the luminance component Y by the first filter 5. The first filter 5, by utilizing the fuzzy logic inference operations carried out on the digital signal included in the working window shown in FIG. 2, can determine whether the digital signal X, whereat the window is centered, contains noise. Based on this determination, the output from the first filter 5 will act as a soft switch, between the original digital signal and the output of a conventional median filter.

The reduction in gaussian noise is performed by the second filter 6. It should be noted that the last-mentioned noise is correlated in space much more than in time. Thus, the digital signals belonging to the preceding image field are used to filter the digital signal from the current image field, according to the following formula:

$$Ynr=knr*(Pi+Pj)/2+(1-knr)*X \quad (2)$$

where: Ynr is the filtered digital signal; knr is 0 when the digital signal is moving and 1 when the digital signal is stationary; Pi and Pj are digital signals along the direction with the greatest amount of correlation, in order to improve the filter performance in relation to edge attenuation.

The second filter 6, by using the fuzzy logic inferential operations, detects the movement as well as the edge of the video image.

The fuzzy process output is a value of knr within the range of {0, 1}.

The formula (2) effects a soft switch between an approach wherein a movement or non-movement is processed along the direction of greatest correlation.

The parameter knr is also used to reduce gaussian noise present in the chrominance components U and V. In this case, due to the bandwidth of the television signal associated with the chrominance components, no directional filtering is carried out, and only the vertical direction is taken into consideration.

The scan conversion will now be discussed. In relation to scan conversion, a procedure closely resembling that of the formula (2) above can be followed to determine the digital signal to be interpolated.

In fact, if the signal is stationary, the second filter would output the current digital signal, or alternatively, the averaged value along an edge. Therefore:

$$Ysrc=ksrc*(Pi+Pj)/2+(1-ksrc)*X \quad (3)$$

where: ksrc is 1 when the digital signal is moving, or 0 when the signal is stationary. Since:

$$ksrc=1-knr$$

the formula (3) can be rewritten as follows:

$$Ysrc=knr*X+(1-knr)*(Pi+Pj)/2$$

It will be more convenient to substitute the output Ynr obtained from the noise reduction for the original digital signal X, so that the interpolation is carried out on noise-free digital signals. Thus, the following relation is obtained:

$$Ysrc=knr*Ynr+(1-knr)*(Pi+Pj)/2$$

For the chrominance component, the procedure is much the same as the previous ones. In particular, the following formulae are used:

$$UVnr=knr*(P2uv+P5uv)/2+(1-knr)*Xuv$$

This formula applies to the noise reduction step, while the following applies to interpolation:

$$UVsrc=knr*UVnr+(1-knr)*(P2uv+P5uv)/2$$

where: P2uv and P5uv are digital signals along the vertical direction.

Furthermore, the device 1 performs, on the components Y, U and V of the television signal, a vertical format conversion in accordance with the method described above.

By means of the third filter 8, the device 1 also performs, respectively on the low-pass Ylp and the high-pass Yhp components, a decrease in brilliance and corresponding increase in contrast, using the following method. The filter estimates the mean brilliance values associated with the image and an image window obtained by suitably delaying the digital signals input thereto. Based on these values, the third filter 8 performs a decrease in brilliance on the component Ylp, using a first fuzzy procedure. Based on this decrease, it performs an increase in contrast on the component Yhp, using a second fuzzy procedure.

In conclusion, the device of this invention, by utilizing fuzzy logic signal processing methods, provides technical advancements and significantly improves the quality of the TV picture.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A device for filtering video images comprising:

first and second circuit portions, each circuit portion having first and second input terminals that defines the video images, respectively adapted to receive a digitalized luminance component and a digitalized chrominance component of a television signal, and an output terminal corresponding to an output terminal of the device, the first circuit portion further including a first filter, a second filter, and a third filter, the first, second and third filters being cascade coupled, the second circuit portion further including a fourth filter, wherein each of the first, second and third filters includes computational circuit means for processing the digitalized luminance component with fuzzy logic, and wherein the fourth filter includes computational circuit means for operating on the digitalized chrominance component according to a parameter supplied from the second filter.

2. The device of claim 1, wherein the computational circuit means of the first filter is fuzzy hardware adapted to perform, on a suitably delayed digitalized luminance component of the television signal, inference operations to produce a reduction in television signal pulsive noise.

3. The device of claim 2, wherein a first line memory is connected between the first input terminal of the first circuit portion and a first input terminal of the first filter.

4. The device of claim 1, wherein the computational circuit means of the second filter is fuzzy hardware adapted to perform, on the digitalized luminance component of the television signal, inference operations to produce a reduction in television signal gaussian noise and a scan rate conversion on the television signal.

5. The device of claim 4, wherein the second filter has a first output terminal connected to a circuit node and a first input terminal of the third filter.

6. The device of claim 4, wherein the second filter has a third output terminal connected to a first input terminal of the fourth filter.

7. The device of claim 4, wherein the first circuit portion further includes a first format converter circuit connected between the second filter and the third filter, and arranged to process a suitably digitalized luminance component to produce a vertical format conversion of the television signal.

8. The device of claim 7, wherein a fifth line memory is connected between a second output terminal of the second filter and an input terminal of the first format converter circuit.

9. The device of claim 1, wherein the third filter is a dual channel filter acting on low-pass and high-pass components of the digitalized luminance component of the television signal.

10. The device of claim 9, wherein the computational circuit means of the third filter is fuzzy hardware that processes suitably delayed low-pass and high-pass components of the digitalized luminance component, according to first and second fuzzy procedures to produce a reduction in brilliance and concurrently increased television signal contrast.

11. The device of claim 10, wherein each of a second line memory and a third line memory have an output terminal connected to a second input terminal and a third input terminal, respectively, of the third filter.

12. The device of claim 10, wherein the second filter has a first output terminal connected to a circuit node and a first input terminal of the third filter.

13. The device of claim 5, wherein the first circuit portion further includes a first format converter circuit connected between the second filter and the third filter, and arranged to process a suitably digitalized luminance component to produce a vertical format conversion of the television signal.

14. The device of claim 13, wherein a fifth line memory is connected between a second output terminal of the second filter and an input terminal of the first format converter circuit.

15. The device of claim 1, wherein the computational circuit means of the fourth filter performs, on suitably delayed digitalized chrominance components of the television signal including the digitalized chrominance component, operations resulting in a reduction of television signal gaussian noise and a scan rate conversion of the television signal.

16. The device of claim 15, wherein a fourth line memory is connected between the first input terminal of the second circuit portion and a second input terminal of the fourth filter.

17. The device of claim 15, wherein the second circuit portion includes a second format converter circuit coupled between the fourth filter and the output terminal of the second circuit portion, and arranged to process the digitalized chrominance components to produce a vertical format conversion of the television signal.

18. The device of claim 17, wherein a sixth line memory is connected between an output terminal of the fourth filter and an input terminal of the second format converter circuit.

19. The device of claim 18, wherein at least a seventh line memory is interconnected between an output terminal of the second format converter circuit and the output terminal of the second circuit portion.

20. The device of claim 15, wherein the second filter has a third output terminal connected to a first input terminal of the fourth filter.

21. A method for filtering a television signal encoded in digital form, comprises:

a pulsive noise reduction step;

a gaussian noise reduction and consequent scan rate conversion step; and a brilliance reduction and concurrent contrast increase step, wherein each step includes the step of processing the television signal by operating a computational circuit using logic of the fuzzy type.

22. The method of claim 21, wherein the pulsive noise reduction step is performed on a digitalized luminance component of the television signal.

23. The method of claim 22, wherein a measurement of the pulsive noise is taken within the operating computational circuit using logic of the fuzzy type.

24. The method of claim 21, wherein the gaussian noise reduction and consequent scan rate conversion step is performed on a digitalized luminance component of the television signal.

25. The method of claim 24, wherein the gaussian noise reduction and consequent scan rate conversion step is further performed on a digitalized chrominance component of the television signal, and is dependent on parameters obtained during the gaussian noise reduction and scan rate conversion step performed on the digitalized luminance component.

26. The method of claim 25, wherein a measurement of both motion and an edge of a corresponding image to the television signal is taken within the operating computational circuit using logic of the fuzzy type.

27. The method of claim 21, wherein the brilliance reduction and concurrent contrast increase step is performed on a digitalized luminance component of the television signal.

28. The method of claim 27, wherein an estimate of averaged brilliance values associated with a corresponding image to the television signal is made within the operating computational circuit using logic of the fuzzy logic.

29. The method of claim 27, wherein an estimate of averaged brilliance values associated with a working window which includes a plurality of digital image signals is made within the operating computational circuit using logic of the fuzzy type.

30. A system for filtering video images in a television apparatus, comprising:

a first memory for a preceding image field having a first input terminal, a second input terminal, a first output terminal, and a second output terminal;

a second memory for a current image field having a first input terminal, and a second input terminal, connected to inputs of the television apparatus, and adapted to receive luminance and chrominance components through an analog-to-digital converter block, and a first output terminal and second output terminal;

a digital-to-analog converter block having a first input terminal, a second input terminal, a first output terminal, and a second output terminal, each output terminal corresponding to output terminals of the television apparatus; and a television signal filtering device operated to a logic of the fuzzy type, and being feedback-connected to the first and second input terminals of the first memory, the television signal filtering device having input terminals connected to the first and second output terminals of each of the first memory and the second memory, and output terminals connected to the first and second input terminals of the digital-to-analog converter block.

31. A device for filtering a video signal having a luminance component and a chrominance component, the device comprising:

luminance processing means for processing the luminance component of the video signal to produce a fuzzy logic signal indicative of whether an image defined by the video signal is moving, and a luminance output signal; and a chrominance processing circuit that processes the chrominance component of the video signal according to the fuzzy logic signal to produce a chrominance output signal.

32. The device of claim 31, wherein the luminance processing means includes:

pulsive noise reducing means for reducing pulsive noise in the luminance component of the video signal; and gaussian noise reducing means, coupled to the pulsive noise reducing means, for reducing gaussian noise in the luminance component of the video signal, and producing the fuzzy logic signal.

33. The device of claim 31, wherein the luminance processing circuit includes:

a pulsive noise filter having an input corresponding to the input of the luminance processing circuit, and an output that provides a pulsive noise filtered signal; and a gaussian noise filter having an input coupled to the output of the pulsive noise filter, a first output coupled to the output of the luminance processing circuit, and a second output corresponding to the second output of the luminance processing circuit.

34. A device for filtering a video signal having a luminance component and a chrominance component, the device comprising:

a luminance processing circuit having an input that receives the luminance component of the video signal, a first output that provides a luminance output signal, and a second output that provides a fuzzy logic signal indicative of whether an image defined by the video signal is moving; and a chrominance processing circuit having a first input that receives the chrominance component of the video signal, a second input coupled to the second output of the luminance processing circuit and an output that provides a chrominance output signal according to the fuzzy logic signal.

35. A method for filtering a video signal having a luminance component and a chrominance component, the method comprising the steps of:

processing the luminance component of the video signal through luminance fuzzy logic circuitry to produce a luminance output signal, and a fuzzy logic signal indicative of whether an image defined by the video signal is moving; and processing the chrominance component of the video signal through chrominance fuzzy logic circuitry to produce a chrominance output signal according to the fuzzy logic signal.

36. The method of claim 35, wherein the step of processing the luminance component of the video signal includes the steps of:

filtering pulsive noise from the luminance component of the video signal to produce a pulsive noise filtered signal; and filtering gaussian noise from the pulsive noise filtered signal to produce a pulsive noise and gaussian noise filtered signal and the fuzzy logic signal.

* * * * *